United States Patent [19]

Yepez, III et al.

[11] Patent Number: 5,535,168
[45] Date of Patent: Jul. 9, 1996

[54] METHOD AND APPARATUS FOR SELECTIVELY ERASING MEMORY TO EXTEND BATTERY LIFE

[75] Inventors: Esteban Yepez, III, Bartlett; Giuseppe M. DiPrizio, Chicago, both of Ill.

[73] Assignee: Motorola, Inc., Schaumburg, Ill.

[21] Appl. No.: 347,751

[22] Filed: Dec. 1, 1994

[51] Int. Cl.⁶ .................................................. G11C 13/00
[52] U.S. Cl. .............................. 365/227; 365/63; 257/922
[58] Field of Search ............................... 365/189.01, 229, 365/226, 211, 227, 218, 51, 52, 63; 380/4; 257/922

[56] References Cited

U.S. PATENT DOCUMENTS

| | | | |
|---|---|---|---|
| 4,933,898 | 6/1990 | Gilberg et al. | 365/63 X |
| 5,185,717 | 2/1993 | Mori | 365/63 X |
| 5,249,227 | 9/1993 | Bergum et al. | 380/4 |
| 5,301,161 | 4/1994 | Landgraf et al. | 365/229 |

*Primary Examiner*—Joseph A. Popek
*Attorney, Agent, or Firm*—James A. Coffing

[57] ABSTRACT

Memory (120) in a device (100) that includes a power source (105) is erased when an alarm triggering event is detected. An alarm signal is provided that is used to determine whether the memory (120) has been erased since a transition from normal to low power mode. It is only when the memory (120) has not been erased since such a transition, that the memory (120) is erased, thereby providing an energy efficient erasure process.

20 Claims, 2 Drawing Sheets

METHOD AND APPARATUS FOR SELECTIVELY ERASING MEMORY TO EXTEND BATTERY LIFE

FIELD OF THE INVENTION

The present invention relates to erasing the memory in a device including, but not limited to, a method and apparatus of erasing the memory of a device during standby power operation.

BACKGROUND OF THE INVENTION

A secure communications unit uses a set of unique numbers, called keys, to encrypt and decrypt messages. These encryption keys must be stored in memory until they are replaced with new keys or are erased. The device responsible for the maintenance of these keys works as a sentry device. The sentry device continuously monitors the environment and erases these keys upon the detection of an illegal, or alarm-triggering, event.

As with many such devices, a battery provides power to the sentry device when normal power is unavailable. During the monitoring process, the power consumed by the sentry device is negligible. However, a great deal of energy is exhausted to erase the keys from the memory when an illegal event is detected.

Prior art sentry devices currently do not check if the keys in memory were already erased and proceed to re-erase keys whenever improper usage or handling is detected. These unnecessary key erases decrease battery life without performing a beneficial task.

In present secure memory devices, the secure memory is erased each time an alarm condition occurs while operating in the standby power mode. This in turn requires a standby power source to supply power to perform the erasure of the secure memory even though secure information had already been erased from the memory device. This method is both costly and inefficient.

Accordingly, a need exists for a method that erases memory in a device only when absolutely required to maintain the integrity and security of the device.

DESCRIPTION OF A PREFERRED EMBODIMENT

Generally, the present invention provides a method and apparatus of erasing memory to extend battery life. This is accomplished by detecting an alarm-triggering event and providing an alarm signal. A determination is then made as to whether the memory has been erased. When it is determined that the memory has not yet been erased, the memory is erased, thereby preventing multiple erases of the memory.

Figure 1:
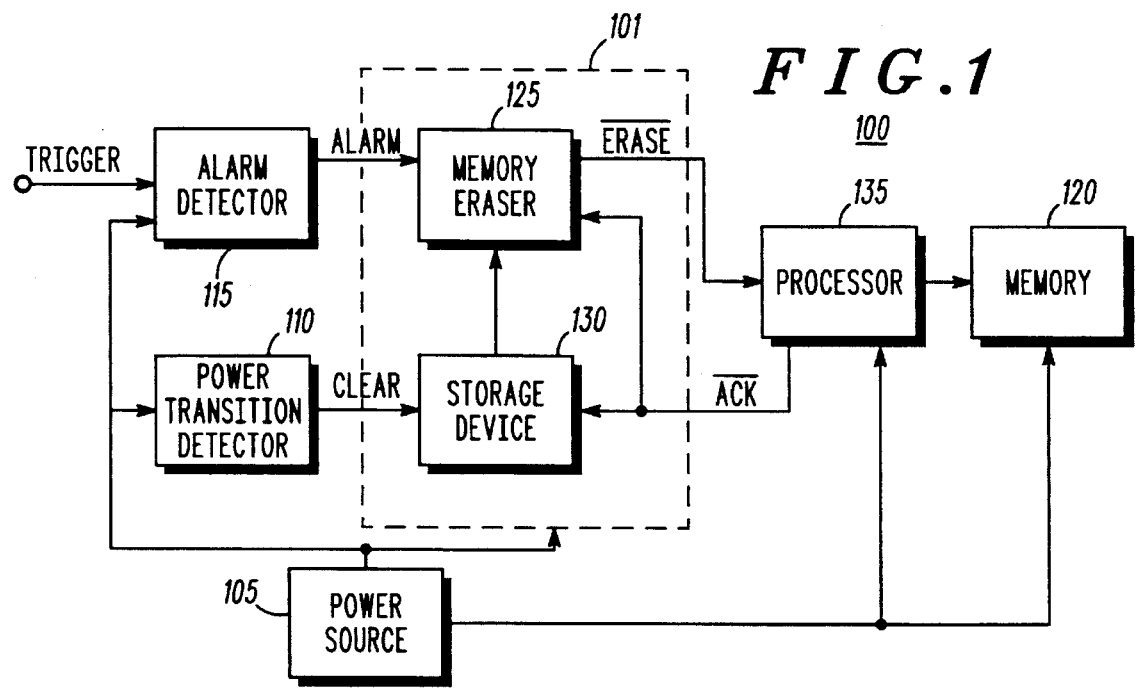
FIG. 1 illustrates a block diagram of a device in accordance with the present invention.

The present invention can be more fully described with reference to FIGS. 1–4. FIG. 1 illustrates a block diagram of a device (100) that includes a power source (105), a power transition detector (110), an alarm detector (115), memory (120), a memory sentry device (101) that includes a memory eraser (125) and a storage device (130), and a processor (135). The power source (105) distributes power to the memory sentry device (101), the alarm detector (115), the power transition detector (110), and memory (120) during normal power mode and standby power mode. It provides power to the processor (135), the alarm detector (115), the power transition detector (110), and the remainder of the device (100) during normal power mode, while facilitating memory (120) erasure during standby power mode, as later described. In a preferred embodiment, the normal power mode utilizes an external power source, while standby power mode uses an internal battery.

The power transition detector (110) monitors the power source (105) to determine when the standby power mode is active. It clears and inhibits the storage device (130) during normal power mode and enables it during a transition from normal to standby power mode. In a preferred embodiment, the power transition detector is an ICL7665 voltage detector, as manufactured by Harris Corporation. The alarm detector (115) sends a signal to the memory eraser (125) when it detects an illegal event. An illegal event indicates improper usage or handling. It can be detected and latched with a flip-flop, such as a 74AC74 Flip-Flop, as manufactured by Motorola, Inc. Examples of inputs to the alarm detector (115) include a tamper switch, a voltage detector and a temperature sensor.

The memory eraser (125) uses information from the alarm detector (115) and storage device (130) to erase memory (120). It sends a signal to the processor (135) to erase memory (120) if the alarm detector (115) detects an alarm and the storage device (130) indicates that the memory (120) is not erased. In a preferred embodiment, the memory eraser (125) comprises a 74AC74 Flip-Flop that sends a continuous signal to a level-sensitive device. This embodiment requires the receipt of an acknowledgment to stop the signal. The memory eraser (125) can also generate a short-pulse signal for an edge-sensitive device. The memory eraser (125) could be a buffer connected to the alarm detector (115), where the storage device must be able to disable this buffer. A preferred embodiment of this design is implemented with a tri-state buffer from an 74AC126, as manufactured by Motorola, Inc., and a pull-up resistor. The processor (135) erases the memory (120). It may also send an acknowledgment to the memory eraser (125) and the storage device (130) when the memory (120) is erased. In a preferred embodiment, the processor is an 68HC11A8 central processing unit, as manufactured by Motorola, Inc.

The memory (120) is used to retain vital information for the device (100). The processor (135) must be able to write to the memory (120) to store new information and write over existing information, thereby erasing the information. In a preferred embodiment, the memory (120) is an HM628128 128K×8 bit RAM. The storage device (130) stores the acknowledgment from the processor (135) when the memory is erased and the power transition detector (110) indicates that the device (100) is in standby power mode. The storage device (130) is held in "Clear" when the power transition detector (110) indicates that the device (100) is in normal power mode. In a preferred embodiment, the storage device (130) comprises a 74AC74 Flip Flop.

When the main power source shuts down, the power source (105) provides power only to the memory sentry device (101), the power transition detector (110), the alarm detector (115), and the memory (120). The power transition detector (110) indicates that the device (100) is in standby power mode and enables the storage device (130). If the alarm detector (115) detects a high temperature condition, the alarm detector (115) sends an alarm to the memory eraser (125). The storage device (135) indicates that the memory has not been erased, and consequently the memory eraser (125) sends an erase signal to the processor (135) and the power source (105). The power source (105) distributes power to the processor (135), which receives the erase signal, erases the memory (120), and sends an acknowledgment to the device (101). The acknowledgment is stored by the storage device (130), and the memory eraser (125) stops the erase signal. The power source (105) shuts down the processor (135) and the remainder of the device (100).

If the alarm detector (115) detects a subsequent triggering event (e.g., a tamper condition), the alarm detector (115) sends a different alarm to the memory eraser (125). The storage device (130) indicates that the memory (120) has been erased, consequently the memory eraser (125) does not erase the memory (120). This capability of selective erasure provides a distinct advantage over prior art sentry devices.

When the main power source is restored, the power transition detector (110) indicates normal power mode. The power source (105) distributes power to all devices (100). The storage device (130) is cleared and disabled by the power transition detector (110), and now indicates that the memory (120) is not erased. If the alarm detector (115) senses an over-voltage condition on the main power supply, it sends an alarm to the memory eraser (125). Since the storage device (130) indicates that the memory (120) has not been erased, it sends the erase signal to the processor (135). The processor (135) erases the memory (120) and sends an acknowledgment to the device (101). The memory eraser (125) ends the erase signal. The storage device (130) is unable to store the acknowledgment because the storage device (130) is disabled and will still indicate that the memory (120) has not been erased.

Figure 2:
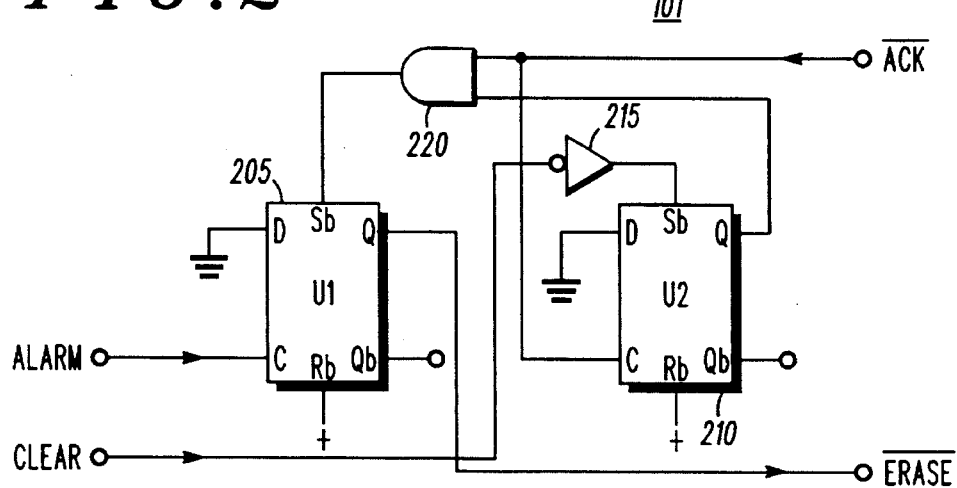
FIG. 2 illustrates a circuit diagram of a memory sentry device as shown in FIG. 1.

FIG. 2 illustrates a circuit diagram of the memory sentry device (101). The memory sentry device (101) includes a first flip flop (205), a two input AND gate (220), a second flip flop (210) and an inverter (215). In a preferred embodiment, no alarms exist in an initial configuration of the memory sentry device (101). In particular, the signals "ALARM" and "CLEAR" are low and the signals "ACK-bar" and "ERASE-bar" are high (note: "X-bar" syntax hereafter equates to the logical function NOT-X). Further, Sb and Q of the second flip flop (210) are high, and the output of the two input AND gate (220) is high.

There exist four phases that the memory sentry device (101) operates in, described below in detail. The first phase is when it receives an alarm for the first time since entering standby power mode. The second phase that the memory sentry device (101) operates in is the storage of the acknowledgment by the storage device. The third phase represents the clearing of the stored acknowledgment within the storage device, and the fourth phase is when the memory sentry device (101) goes back to its initial configuration.

The first phase occurs when the "ALARM" signal goes high, the first flip flop (205) is clocked and its Q output ("ERASE-bar") goes low. "ERASE-bar" stays low until "ACK-bar" goes low. When "ACK-bar" goes low, the output of the two input AND gate (220) goes low and the Q output ("ERASE-bar") of the first flip flop (205) returns back to high. When "ACK-bar" goes high again, the second flip flop (210) is clocked and its Q output goes low. This action forces the output of the two input AND gate (220) to remain low regardless of the level of "ACK-bar". Therefore, the Q output of the first flip flop (205) remains high regardless of the level of "ALARM." This represents the second phase of the memory sentry device (101). When "CLEAR" goes high, Sb of the second flip flop (210) goes low and its Q output returns to high. The output of the two input AND gate (220) goes high and is again dependent on "ACK-bar." This represents the third phase of the memory sentry device (101). When "CLEAR" goes low, the memory sentry device (101) returns to its initial configuration, phase four.

Figure 3:
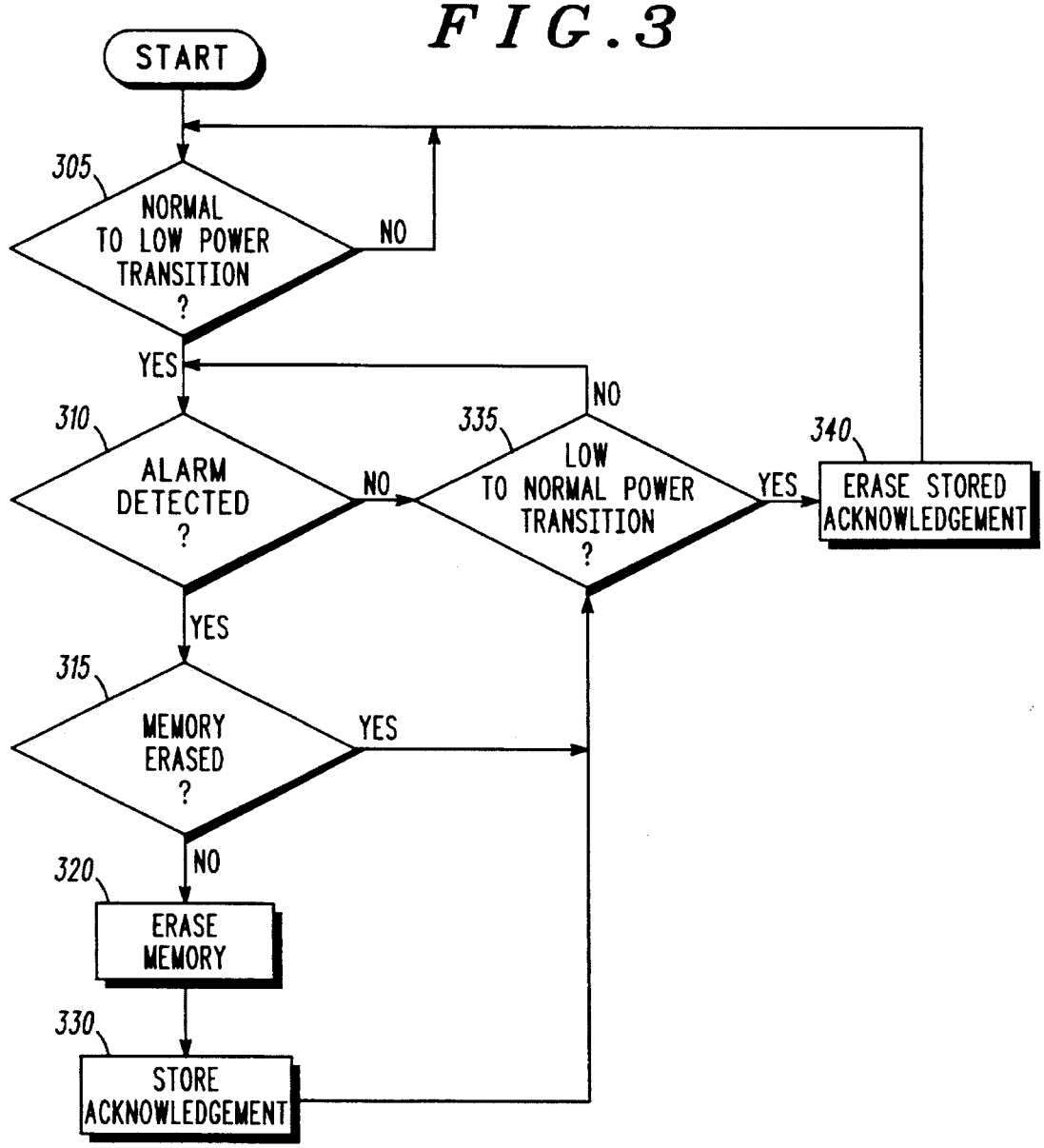
FIG. 3 illustrates a logic diagram that a device may use to implement the present invention.

FIG. 3 illustrates a flow diagram depicting operation of the memory sentry device, in accordance with the present invention. The power transition detector continuously monitors (305) the main power source until a normal-to-low power transition occurs. When a normal to low power transition occurs, the alarm detector monitors (310) the environment for triggering events. A triggering event might include opening the housing containing the device, operating the device at extreme high or extreme low temperatures, operating the device at excessive voltage levels, or even an external 'erase memory' command. Different devices monitor each of these conditions and change their output when their environmental variable exceeds a pre-determined threshold.

Once an alarm is detected, the .memory eraser determines (315) whether or not the memory has been erased. The event of erasing the memory is stored by the storage device when the memory is erased. Methods of storing this event might include storing an acknowledgment after the memory is erased, storing an alarm received by the memory eraser, or storing the erase signal sent by the memory eraser. When the storage device indicates that the memory has not been erased, the memory is erased (320), using known erasure techniques—e.g., a processor writing information to memory.

After the memory is erased, the memory sentry device stores (330) an erasure acknowledgment to indicate that the memory has been erased. (It should be noted that this acknowledgment is not required in the case where the erase signal sent by the memory eraser is stored by the storage device.)

When no alarm has been detected (310), the memory has already been erased (315), or the acknowledgment has been stored (330), the power transition detector monitors (335) the main power source, to determine whether a low-to-normal power transition has occurred. Normal power mode is indicated when the main power source exceeds a minimum voltage. When the main power source does not exceed the minimal voltage (i.e., the device remains in low power mode), the alarm detector continues to monitor (310) for alarms. When a low-to-normal power transition occurs (i.e., the main power source exceeds the minimal voltage), the stored acknowledgment is erased (340). In this manner, the memory sentry device is ensured to erase the memory in low power mode only when absolutely required for system integrity purposes.

It should be noted that the power transition determinations (305, 335) are not necessary for proper operation of the memory sentry device. That is, while the input of the power transition detector is used to determine when to clear the storage device, the clear signal could, in an alternate embodiment, be a pulse generated from a processor or other device to indicate when the memory is restored. This functionality merely allows the memory sentry device to operate under both normal and standby power modes.

Figure 4:
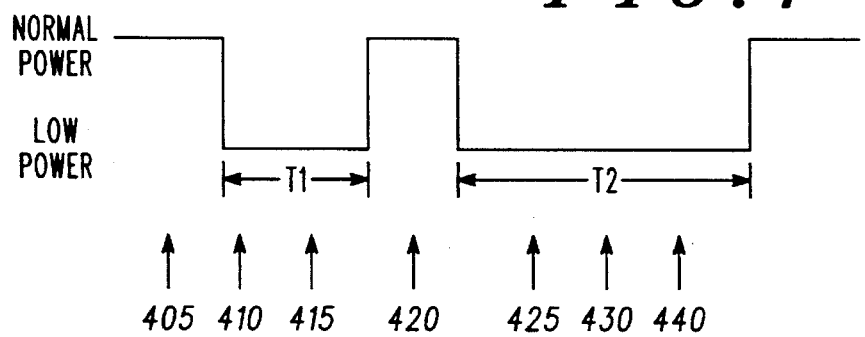
FIG. 4 illustrates a timing diagram in accordance with the present invention.

FIG. 4 illustrates a timing diagram depicting exemplary power transition sequences and corresponding events, in accordance with the present invention. During normal power, when a triggering event occurs (405), the storage device indicates that the memory has not been erased, and the memory eraser proceeds to erase the memory. The storage device does not store the event of erasing the memory since it is held in clear by the power transition detector while in the normal power mode.

After a transition from normal power to low power (i.e., standby or battery operation), the storage device is no longer held in clear by the power transition detector. For example, when a triggering event occurs (410), the storage device indicates that the memory has not been erased, and the memory eraser proceeds to erase the memory. The event of erasing the memory is stored by the storage device. Thus, while in low power mode, when another triggering event occurs (415) within time T1 (i.e., before the next power transition), the storage device indicates that the memory has been erased, and the memory eraser does not erase the memory. This feature provides a distinct advantage over prior art devices, as energy is not needlessly consumed while in low power mode.

After a transition from low power to normal power mode, the storage device is cleared by the power transition detector. When a triggering event now occurs (420), the storage device indicates that the memory is not erased, and the memory is erased. Again, the storage device does not store the event of erasing the memory since it is held in clear by the power transition detector while in the normal power mode.

After a second transition from normal power to low power, the storage device is no longer held in clear by the power transition detector. When a triggering event now occurs (425), the storage device indicates that the memory has not been erased, and the memory is erased. As before, the event of erasing the memory is stored by the storage device, such that subsequent triggering events (430, 440) occurring within time T2 will not require an unnecessary memory erasure.

The present invention provides a method and apparatus for erasing the memory in a secure memory device during low power (i.e., standby) operation. With such a method and apparatus, the memory is erased only once during standby operation, regardless of subsequent alarm conditions detected before the next power transition. By erasing the memory only once during standby power operation, battery life is extended, as battery power need not be expended to erase the memory.

What is claimed is:

1. In a device including a memory and a power source, a method of erasing the memory, the method comprising the steps of:

detecting an alarm-triggering event;

providing, responsive to the step of detecting, an alarm signal;

determining, responsive to the alarm signal, whether the memory has been erased; and when the device determines that the memory has not been erased, erasing the memory.

2. The method of claim 1, wherein the device operates in a normal power mode and a low power mode, the method further comprising the step of detecting a transition from operation of the device in the normal power mode to operation of the device in the low power mode.

3. The method of claim 1, wherein the step of erasing further comprises the step of storing an acknowledgment after the memory is erased, to produce a stored acknowledgment.

4. The method of claim 3, further comprising the steps of:

detecting a transition from operation of the device in a low power mode to operation of the device in a normal power mode; and when the transition from operation of the device in the low power mode to operation of the device in the normal power mode is detected, erasing the stored acknowledgment.

5. The method of claim 1 wherein the alarm-triggering event comprises a low battery indication.

6. The method of claim 1 wherein the alarm-triggering event comprises an erase memory command.

7. The method of claim 1 wherein the alarm-triggering event comprises an indication that a present operating temperature for the device lies outside a predetermined operating temperature range.

8. The method of claim 1 wherein the alarm-triggering event comprises an indication of unauthorized tampering of the device.

9. The method of claim 1 wherein the device comprises a secure communication device.

10. The method of claim 1 wherein the device comprises a secure memory device.

11. In a device including a memory and a power source, the device operable in a normal power mode and a low power mode, a method of erasing the memory, the method comprising the steps of:

detecting an alarm-triggering event;

providing, responsive to the step of detecting, an alarm signal;

determining, responsive to the alarm signal, whether the memory has been erased;

when the device determines that the memory has not been erased, erasing the memory; and detecting a transition from operation of the device in the normal power mode to operation of the device in the low power mode.

12. The method of claim 11, further comprising the step of storing an acknowledgment, to produce a stored acknowledgment.

13. The method of claim 12, the method further comprising the steps of:

detecting a transition from operation of the device in the low power mode to operation of the device in the normal power mode; and when the transition from operation of the device in the low power mode to operation of the device in the normal power mode is detected, erasing the stored acknowledgment.

14. The method of claim 11, wherein the alarm-triggering event comprises a low battery indication.

15. The method of claim 11, wherein the alarm-triggering event comprises an indication that a present operating temperature for the device lies outside a predetermined operating temperature range.

16. The method of claim 11, wherein the alarm-triggering event comprises an indication of unauthorized tampering of the device.

17. A secure communications device that includes a power source and an erasable memory, the device being operable in a normal power mode and a low power mode, comprising:

an alarm detector;

a memory eraser, operably coupled to the alarm detector;

a processor, operably coupled to the memory eraser and the erasable memory;

a power transition detector, operably coupled to the power source; and storage means, operably coupled to the power transition detector and the memory eraser, for enabling the memory eraser responsive to transitions between the normal power mode and the low power mode.

18. The device of claim 17, wherein the erasable memory stores an encryption key.

19. The device of claim 17, wherein the alarm detector includes an input that is responsive to a memory erase command.

20. The device of claim 17, wherein the alarm detector includes an input that is responsive to a triggering event selected from the group consisting of a low battery indication, a substantial deviation in operating temperature and a tampering condition.

* * * * *